(12) United States Patent
Burghout et al.

(10) Patent No.: US 9,034,733 B2
(45) Date of Patent: May 19, 2015

(54) SEMICONDUCTOR DIE SINGULATION METHOD

(71) Applicant: Semiconductor Components Industries, LLC, Phoenix, AZ (US)

(72) Inventors: William F. Burghout, Mesa, AZ (US); Dennis Lee Conner, Glendale, AZ (US); Michael J. Seddon, Gilbert, AZ (US); Jay A. Yoder, Phoenix, AZ (US); Gordon M. Grivna, Mesa, AZ (US)

(73) Assignee: SEMICONDUCTOR COMPONENTS INDUSTRIES, LLC, Phoenix, AS (US)

( * ) Notice: Subject to any disclaimer, the term of this patent is extended or adjusted under 35 U.S.C. 154(b) by 0 days.

(21) Appl. No.: 14/159,648

(22) Filed: Jan. 21, 2014

(65) Prior Publication Data

US 2014/0134828 A1 May 15, 2014

Related U.S. Application Data

(63) Continuation-in-part of application No. 13/589,985, filed on Aug. 20, 2012, now Pat. No. 8,664,089.

(51) Int. Cl.
| | |
|---|---|
| H01L 21/00 | (2006.01) |
| H01L 21/78 | (2006.01) |
| H01L 21/02 | (2006.01) |
| H01L 21/67 | (2006.01) |

(52) U.S. Cl.
CPC .......... *H01L 21/78* (2013.01); *H01L 21/02076* (2013.01); *H01L 21/67028* (2013.01)

(58) Field of Classification Search
USPC ................... 257/E21.214, E21.237, E21.238, 257/E21.483, E21.596; 438/33, 68, 113, 438/460, 462, 463, 464
See application file for complete search history.

(56) References Cited

U.S. PATENT DOCUMENTS

| | | |
|---|---|---|
| 5,401,690 A | 3/1995 | Chen |
| 5,919,713 A | 7/1999 | Ishii et al. |
| 6,406,979 B2 | 6/2002 | Fischer et al. |
| 7,781,310 B2 | 8/2010 | Grivna |
| 7,985,661 B2 | 7/2011 | Grivna |
| 7,989,319 B2 | 8/2011 | Grivna et al. |
| 8,012,857 B2 | 9/2011 | Grivna et al. |
| 2005/0196940 A1 | 9/2005 | Yajima et al. |
| 2009/0061595 A1 | 3/2009 | Weber et al. |
| 2009/0191690 A1 | 7/2009 | Boyle et al. |
| 2011/0175242 A1 | 7/2011 | Grivna et al. |
| 2011/0177675 A1 | 7/2011 | Grivna et al. |
| 2011/0244657 A1 | 10/2011 | Grivna et al. |

FOREIGN PATENT DOCUMENTS

| | | |
|---|---|---|
| EP | 1873824 A1 | 1/2008 |
| WO | WO2014052445 A1 | 4/2014 |

OTHER PUBLICATIONS

Copy of Search Report for counterpart EP Application No. 13181098.8, dated Nov. 3, 2014, 5 pages.

*Primary Examiner* — Asok K Sarkar
(74) *Attorney, Agent, or Firm* — Kevin B. Jackson

(57) ABSTRACT

In one embodiment, semiconductor die are singulated from a semiconductor wafer having a backmetal layer by placing the semiconductor wafer onto a carrier tape with the backmetal layer adjacent the carrier tape, forming singulation lines through the semiconductor wafer to expose the backmetal layer within the singulation lines, and separating portions of the backmetal layer within the singulation lines using a pressurized fluid applied to the carrier tape.

20 Claims, 12 Drawing Sheets

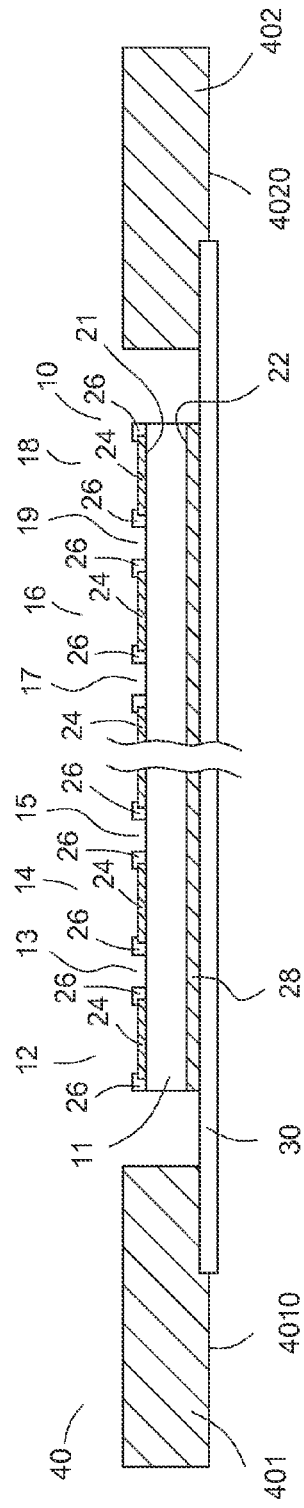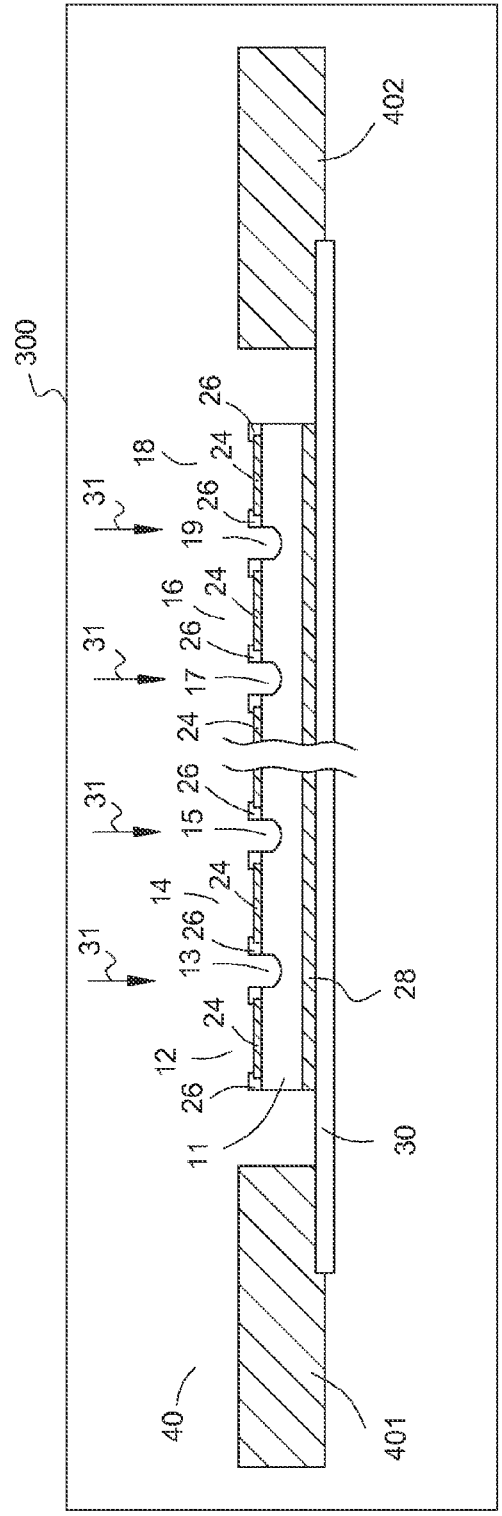

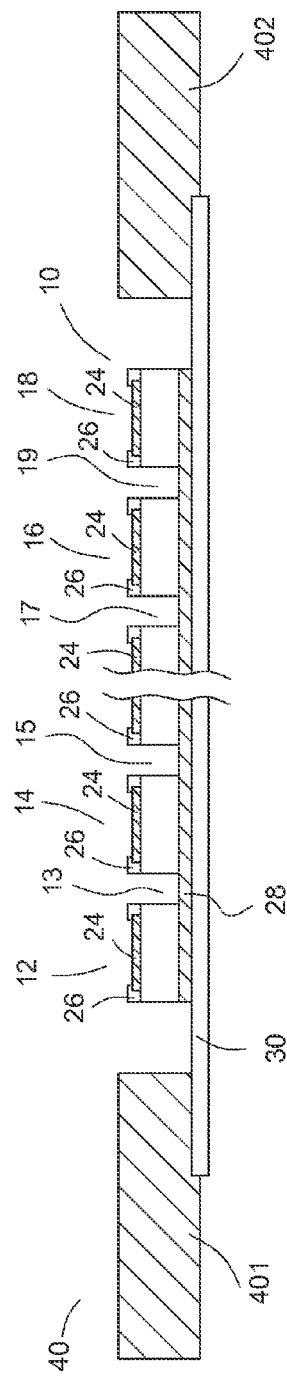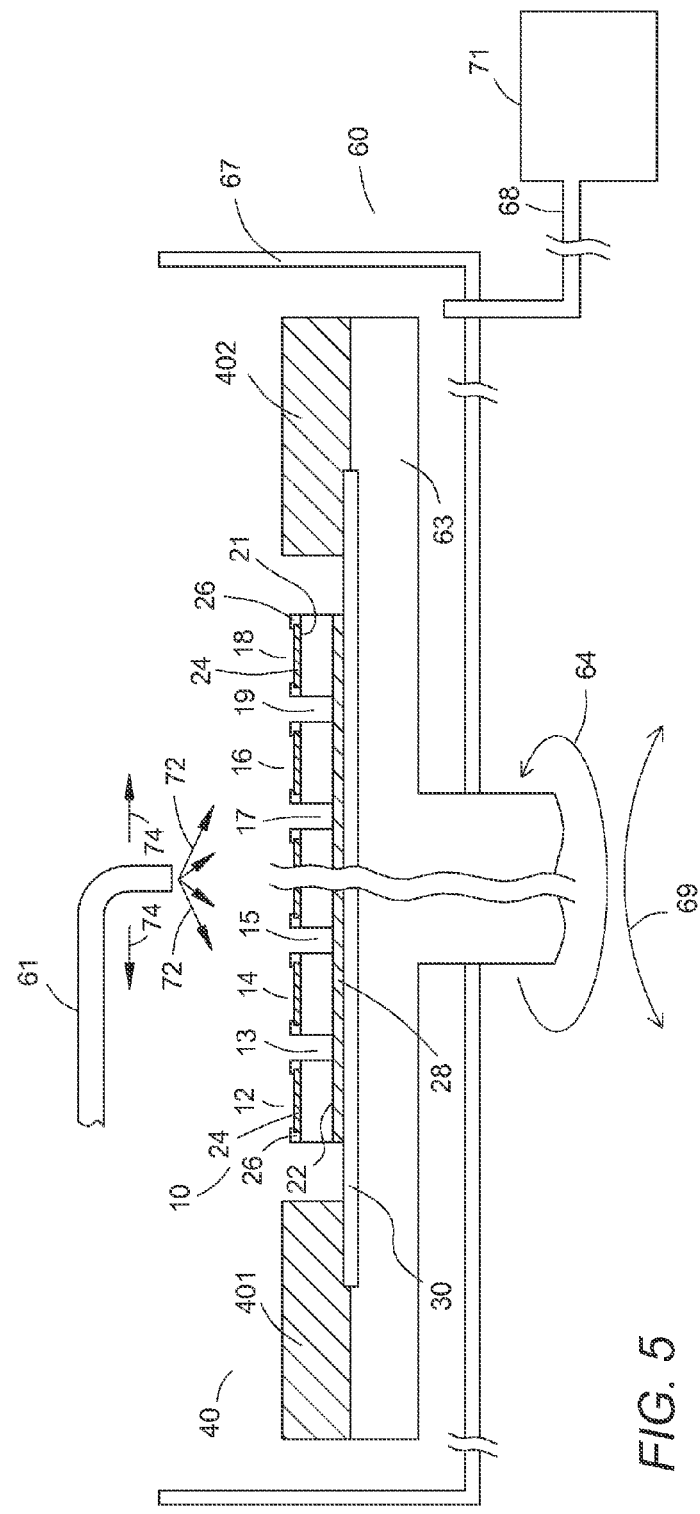

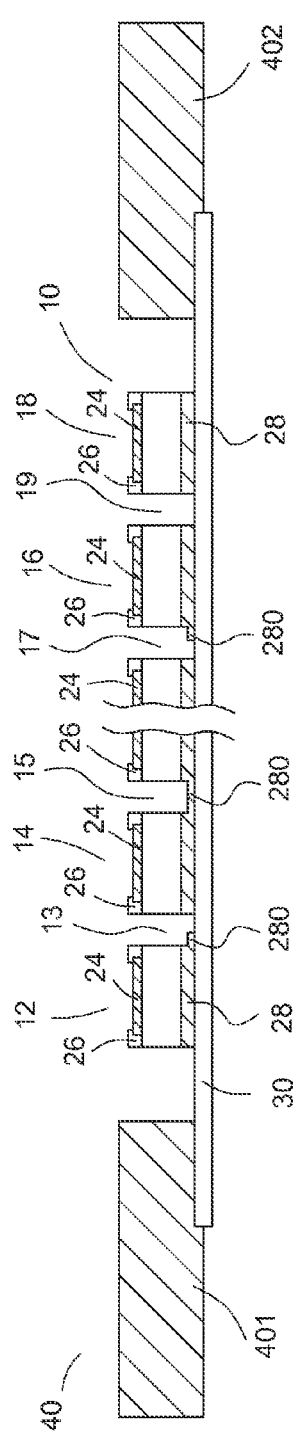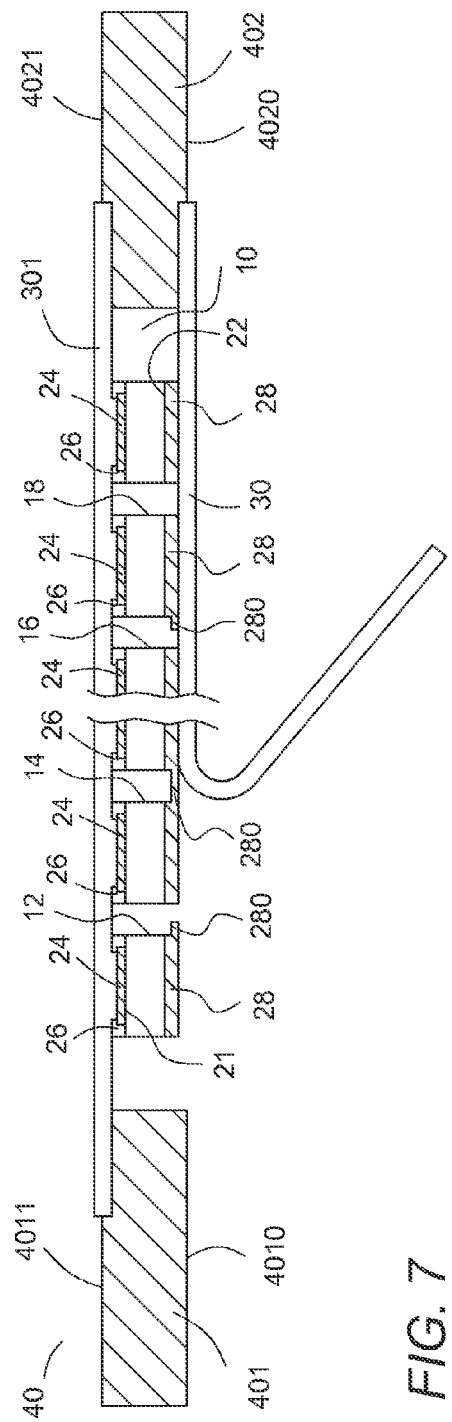

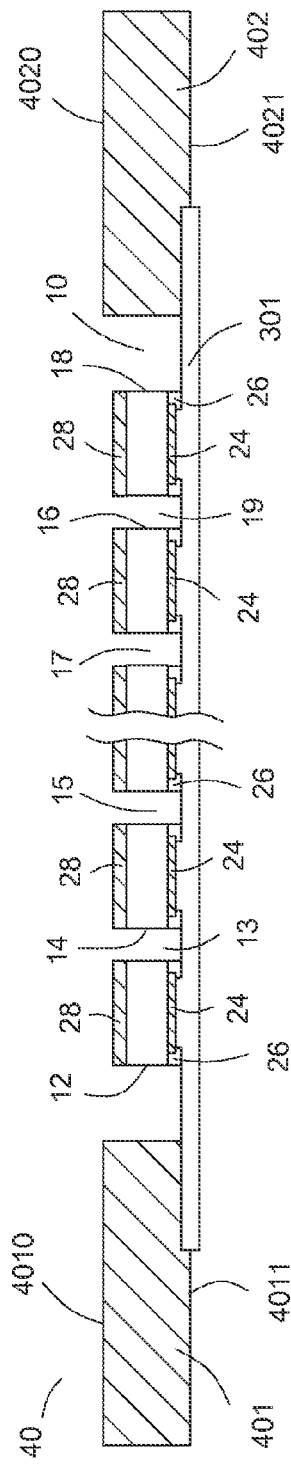

US 9,034,733 B2

SEMICONDUCTOR DIE SINGULATION METHOD

CROSS REFERENCE TO RELATED APPLICATION

This application is a continuation-in-part application of prior co-pending U.S. patent application Ser. No. 13/589,985 entitled SEMICONDUCTOR DIE SINGULATION METHOD filed on Aug. 20, 2012 and issued as U.S. Pat. No. 8,664,089 B1 on Mar. 4, 2014, which is hereby incorporated by reference and priority thereto for common subject matter is hereby claimed.

BACKGROUND OF THE INVENTION

The present invention relates, in general, to electronics and, more particularly, to methods of forming semiconductors.

In the past, the semiconductor industry utilized various methods and equipment to singulate individual semiconductor die from a semiconductor wafer on which the die was manufactured. Typically, a technique called scribing or dicing was used to either partially or fully cut through the wafer with a diamond cutting wheel along scribe grids or singulation lines that were formed on the wafer between the individual die. To allow for the alignment and the width of the dicing wheel each scribe grid usually had a large width, generally about one hundred fifty (150) microns, which consumed a large portion of the semiconductor wafer. Additionally, the time required to scribe each singulation line on the semiconductor wafer could take over one hour or more. This time reduced the throughput and manufacturing capacity of a production facility.

Other methods, which have included thermal laser separation (TLS), stealth dicing (laser dicing from the backside of the wafer), and plasma dicing, have been explored as alternatives to scribing. Plasma dicing is a promising process compared to scribing and other alternative processes because it supports narrower scribe lines, has increased throughput, and can singulate die in varied and flexible patterns. However, plasma dicing has had manufacturing implementation challenges. Such challenges have included non-compatibility with wafer backside layers, such as backmetal layers, because the etch process has been unable to effectively remove the backside layers from the singulation lines. Removing the backside layers from the scribe lines is necessary to facilitate subsequent processing, such as pick-and-place and assembly processes.

Accordingly, it is desirable to have a method of singulating die from a semiconductor wafer that separates the backside layers from within the singulation lines. It would be beneficial for the method to be cost effective, to minimize any damage to or contamination of the separated die, and to support reclaim efforts.

BRIEF DESCRIPTION OF THE DRAWINGS

FIGS. 2-10 illustrate partial cross-sectional views of an embodiment of a the semiconductor wafer of FIG. 1 at various stages in a process of singulating die from the wafer in accordance with an embodiment of the present invention;

For simplicity and clarity of the illustration, elements in the figures are not necessarily drawn to scale, and the same reference numbers in different figures denote the same elements. Additionally, descriptions and details of well-known steps and elements are omitted for simplicity of the description. For clarity of the drawings, certain regions of device structures, such as doped regions or dielectric regions, may be illustrated as having generally straight line edges and precise angular corners. However, those skilled in the art understand that, due to the diffusion and activation of dopants or formation of layers, the edges of such regions generally may not be straight lines and that the corners may not be precise angles. Furthermore, the term "major surface" when used in conjunction with a semiconductor region, wafer, or substrate means the surface of the semiconductor region, wafer, or substrate that forms an interface with another material, such as a dielectric, an insulator, a conductor, or a polycrystalline semiconductor. The major surface can have a topography that changes in the x, y and z directions.

DETAILED DESCRIPTION OF THE DRAWINGS

Figure 1:
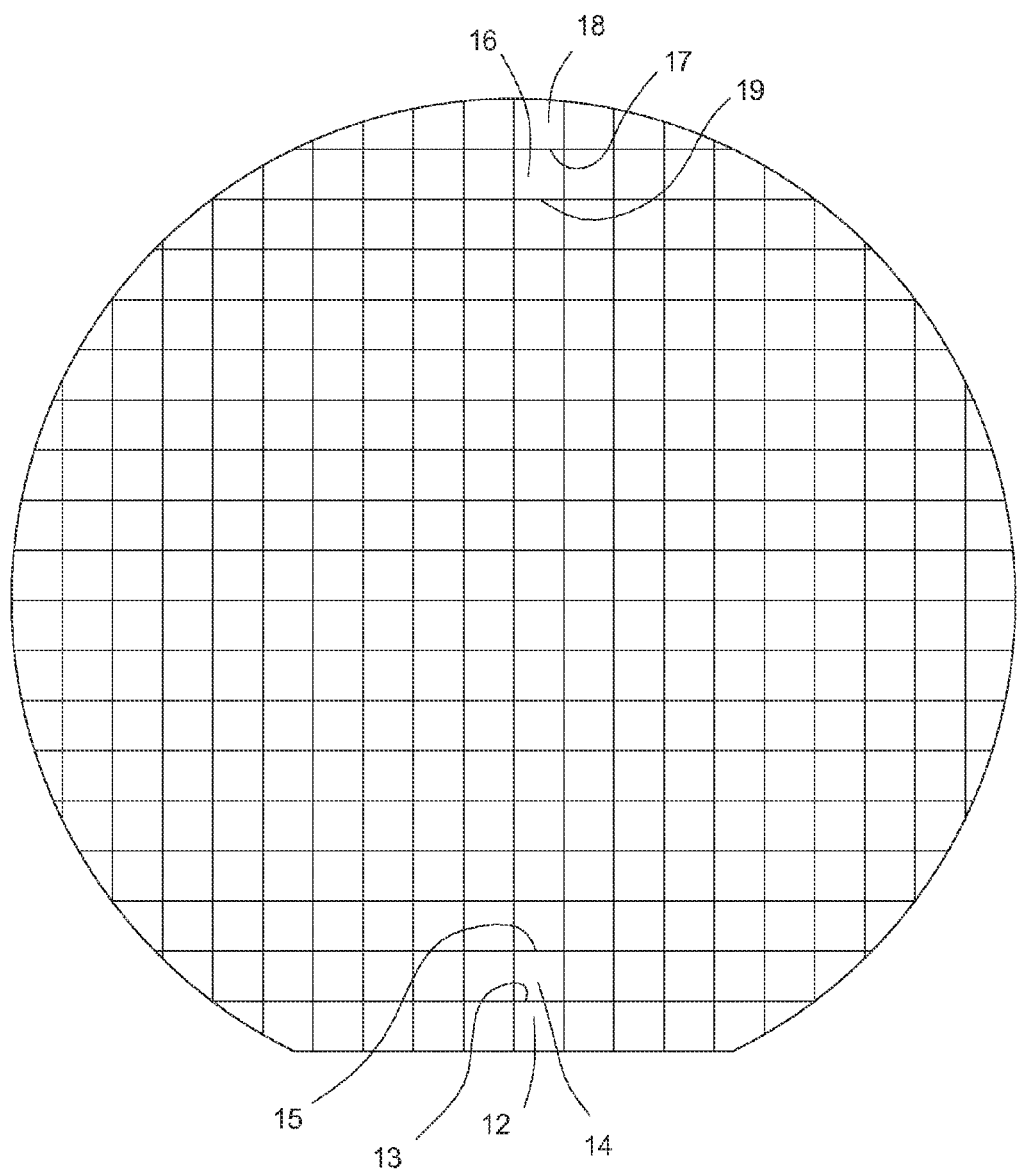
FIG. 1 illustrates a reduced plan view of an embodiment of a semiconductor wafer in accordance with the present invention.

FIG. 1 is a reduced plan view that graphically illustrates a semiconductor wafer 10 at a later step in fabrication. Wafer 10 includes a plurality of semiconductor die, such as die 12, 14, 16, and 18, that are formed on or as part of semiconductor wafer 10. Die 12, 14, 16, and 18 are spaced apart from each other on wafer 10 by spaces in which singulation lines are to be formed or defined, such as scribe lines or singulation lines 13, 15, 17, and 19. As is well known in the art, all of the semiconductor die on wafer 10 generally are separated from each other on all sides by areas where scribe lines or singulation lines, such as singulation lines 13, 15, 17, and 19 are to be formed. Die 12, 14, 16, and 18 can be any kind of electronic device including semiconductor devices such as, diodes, transistors, discrete devices, sensor devices, optical devices, integrated circuits or other devices known to one of ordinary skill in the art. In one embodiment, wafer 10 has completed wafer processing including the formation of a backside layer described hereinafter.

FIG. 2 illustrates an enlarged cross-sectional view of wafer 10 at an early step in a die singulation method in accordance with a first embodiment. In one embodiment, wafer 10 is attached to a carrier substrate, transfer tape, or carrier tape 30 that facilitates supporting the plurality of die after they are singulated. Such carrier tapes are well known to those of skill in the art. In one embodiment, carrier tape 30 can be attached to a frame 40, which can include frame portions or portions 401 and 402. As illustrated, carrier tape 30 can be attached to surface 4010 of frame portion 401 and to surface 4020 of frame portion 402.

In the cross-section illustrated, wafer 10 can include a bulk substrate 11, such as a silicon substrate, which can include opposing major surfaces 21 and 22. In one embodiment, contact pads 24 can be formed along portions of major surface 21 to provide for electrical contact between structures formed within substrate 11 and next levels of assembly or external elements. For example, contact pads 24 can be formed to receive bonding wires or clips that may be subsequently be attached to contact pads 24, or contact pads 24 can be formed to receive a solder ball, bump or other type of attachment structure. Contact pads 24 generally can be a metal or other conductive material. Typically, a dielectric material 26 such as, a blanket deposited dielectric layer can be formed on or overlying major surface 21 to function as a passivation layer for wafer 10. In one embodiment, dielectric material 26 can be a material that etches at a slower rate than that of substrate 11. In one embodiment, dielectric material 26 can be a silicon oxide, silicon nitride, or polyimide when substrate 11 is silicon.

In one embodiment, openings can be formed in dielectric material 26 (and other dielectric layers that can be formed underneath dielectric material 26) to expose underlying surfaces of contact pads 24 and surfaces of substrate 11 where singulation lines 13, 15, 17, and 19 are to be formed. As illustrated and in accordance with the present embodiment, wafer 10 further includes a layer of material 28 formed on or overlying major surface 22 of wafer 10. In one embodiment, layer 28 can be a conductive backmetal layer. In one embodiment, layer 28 can be a multi-layer metal system such as, titanium/nickel/silver, titanium/nickel/silver/tungsten, chrome/nickel/gold, copper, copper alloys, gold, or other materials known to those skilled in the art. In another embodiment, layer 28 can be a wafer backside coating (WBC) film, such as a die-attach coating.

FIG. 3 illustrates an enlarged cross-sectional view of wafer 10 at a subsequent step during a plasma etch singulation process. In one embodiment, wafer 10 can be mounted on carrier tape 30 and then can be placed within an etch apparatus 300, such as a plasma etch apparatus. In one embodiment, substrate 11 can be etched through the openings to form or define singulation lines or openings 13, 15, 17, and 19 extending from major surface 21. The etching process can be performed using a chemistry (generally represented as arrows 31) that selectively etches silicon at a much higher rate than that of dielectrics and/or metals. In one embodiment, wafer 10 can be etched using a process commonly referred to as the Bosch process. In one embodiment, wafer 10 can be etched using the Bosch process in an Alcatel deep reactive ion etch system. In one embodiment, the width of singulation lines 13, 15, 17, and 19 can be from about five microns to about fifteen microns. Such a width is sufficient to ensure that the openings that form singulation lines 13, 15, 17, and 19 can be formed completely through substrate 11 stopping proximate to layer 28 because of the etch selectivity as generally illustrated in FIG. 4. In one embodiment, layer 28 can be used as a stop layer for the plasma etch singulation process. In one embodiment, singulation lines 13, 15, 17, and 19 can be formed in about fifteen to about thirty minutes using the Bosch process.

FIG. 5 illustrates a cross-sectional view of wafer 10 at a subsequent process step. In one embodiment, a pressurized fluid removal step, a fluid ablation step, or a fluid machining step is used to remove portions of layer 28 from within singulation lines 13, 15, 17, and 19 in accordance with the present embodiment. In one embodiment, frame 40 including wafer 10 on carrier tape 30 can be placed in a fluid spin rinse apparatus 60. In one embodiment, major surface 21 of wafer 10 can be facing upward or away from carrier tape 30. In one embodiment, apparatus 60 can be configured with a nozzle or dispense fixture 61 placed above wafer 10 as illustrated in FIG. 5. Frame 40 and carrier tape 30 can be placed on a support structure 63 such as, a vacuum chuck. In one embodiment, structure 63 can be configured to spin or rotate as generally represented by arrow 64. In one embodiment, structure 63 can be configured stretch or expand carrier tape 30, as generally represented by arrow 69, to contribute additional forces to layer 28 to assist in its removal or separation from within the singulation lines.

Apparatus 60 can include a tub or basin structure 67, which can function to contain and to collect process effluent through outlet 68 into a collection tub 71. One benefit of the present method and apparatus is that material from layer 28 removed during the machining process can be saved for reclaim or for an environmentally appropriate disposal technique.

In one embodiment, layer 28 can be removed or machined using the process described above in a Disco brand spin-rinse apparatus. During the process, a machining medium, such as a fluid 72, can be dispensed from nozzle 61 while structure 63 and wafer 10 rotate. In one embodiment, nozzle 61 can move or swing across wafer 10 as generally represented by arrows 74. In one embodiment, fluid 72 can be liquids, gases, mixtures thereof, or another material that removes layer 28 while minimizing damage to or causing unwanted contamination of die 12, 14, 16, and 18. In one embodiment, fluid 72 can be water. In another embodiment, fluid 72 can be air or nitrogen. In one embodiment, a surfactant can be added to fluid 72, such as a Diamaflow™ surfactant manufactured by KETECA of Phoenix, Ariz., U.S.A. In one embodiment, an abrasive material can be added to fluid 72.

In one embodiment, the following process conditions can be used to remove layer 28. For example, fluid 72 can be de-ionized water at a pressure from about 10,342 Kilopascal (Kpa) to about 20,684 Kpa (about 1500 pounds/square inch (psi) to about 3000 psi) as measured at the fluid pump. Wafer 10 can be spinning at a rate from about 700 rpm to 1500 rpm with fluid 72 flowing onto wafer 10 from about 2 minutes to about 5 minutes.

It is understood that the method described herein can also be used to remove other structures, such as alignment keys, test structures, and/or residual semiconductor material, from within singulation lines 13, 15, 17, and/or 19 that may not be removed during the plasma etch process. The steps described hereinafter can be used in one embodiment to removing remaining portions 280 from the singulation lines.

FIG. 6 illustrates a cross-sectional view of wafer 10 after portions of layer 28 within singulation lines 13, 15, 17, and 19 have been removed. As illustrated in this embodiment, portions 280 of layer 28 can remain after the fluid machining process described previously. Portions 280 can remain because singulation lines 13, 15, 17, and 19 are configured with narrower widths when singulation processes, such as plasma-singulation, are used instead of conventional dicing processes that require much wider singulation lines.

FIG. 7 illustrates a cross-sectional view of wafer 10 at a subsequent process step. In one embodiment, carrier tape 30 can be exposed to an ultra-violet (UV) light to source to reduce the adhesiveness of the tape. Subsequently, a carrier tape 301 can be applied or attached to conductive pads 24 along upper surfaces of wafer 10 (that is, overlying major surface 21 of wafer 10), surface 4011 of frame portion 401, and surface 4021 of frame portion 402. In one embodiment, carrier tape 301 and carrier tape 30 can be similar materials. In another embodiment, carrier tape 301 can be a different material or can have different characteristics, such as adhesive and/or stretch characteristics, compared to carrier tape 30. In accordance with the present embodiment, after carrier tape 301 is applied, carrier tape 30 can be removed from wafer 10 and frame 40 to expose layer 28 and portions 280.

Figure 8:
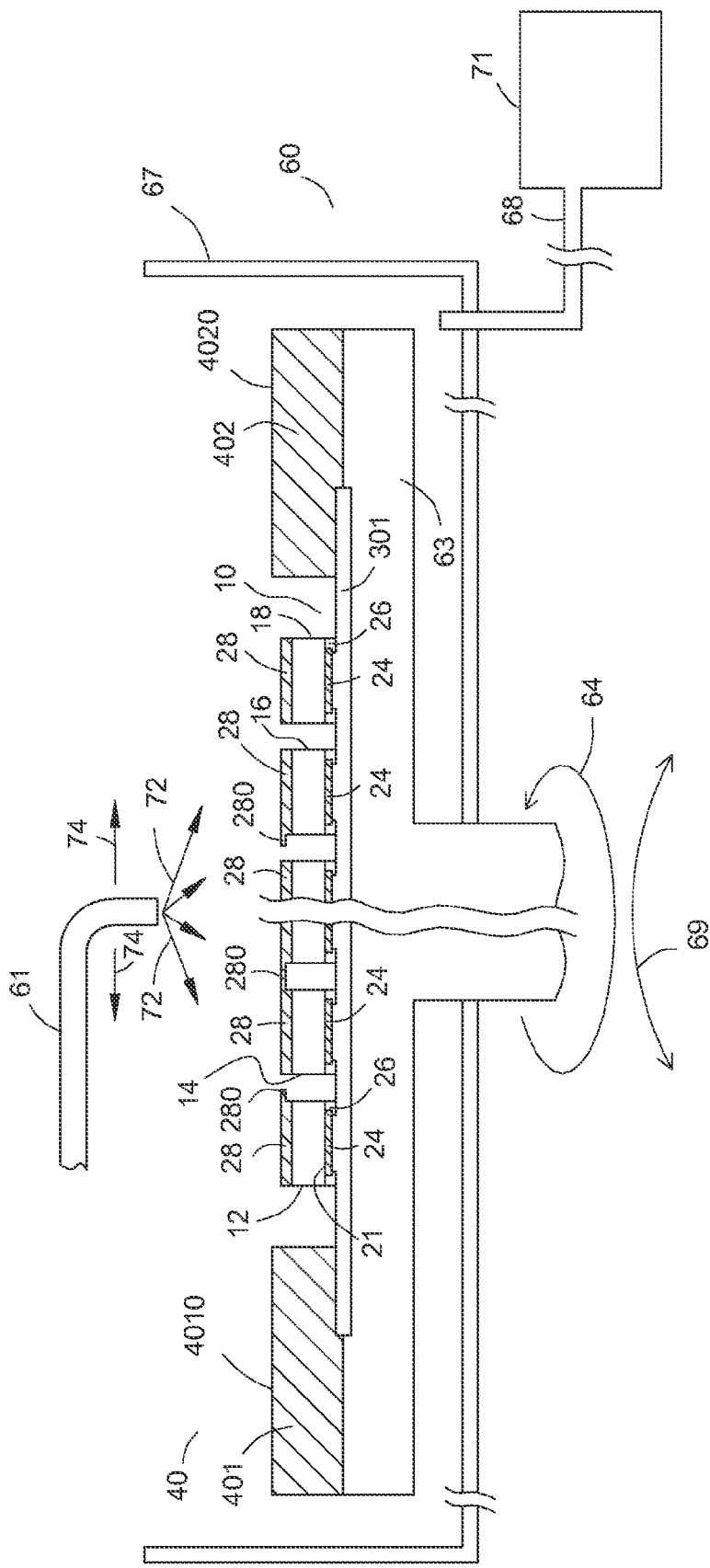

FIG. 8 illustrates a cross-sectional view of wafer 10 during subsequent processing. In one embodiment, wafer 10 is placed again within apparatus 60 with layer 28 facing upward (or towards nozzle 61), and portions 280 of layer 28 can be removed using the fluid machining process as described previously. For example, fluid 72 can be de-ionized water at a pressure from about 10,342 Kpa to about 20,684 Kpa (about 1500 psi to about 3000 psi) as measured at the fluid pump. Wafer 10 can be spinning at a rate from about 700 rpm to 1500 rpm with fluid 72 flowing onto wafer 10 from about 2 minutes to about 5 minutes. In one embodiment, after portions 280 of layer 28 have been removed, as well as any other unwanted materials from singulation lines 13, 15, 17, and/or 19, wafer 10 can be removed from apparatus 60 to provide the intermediate structure illustrated in FIG. 9.

Figure 11:
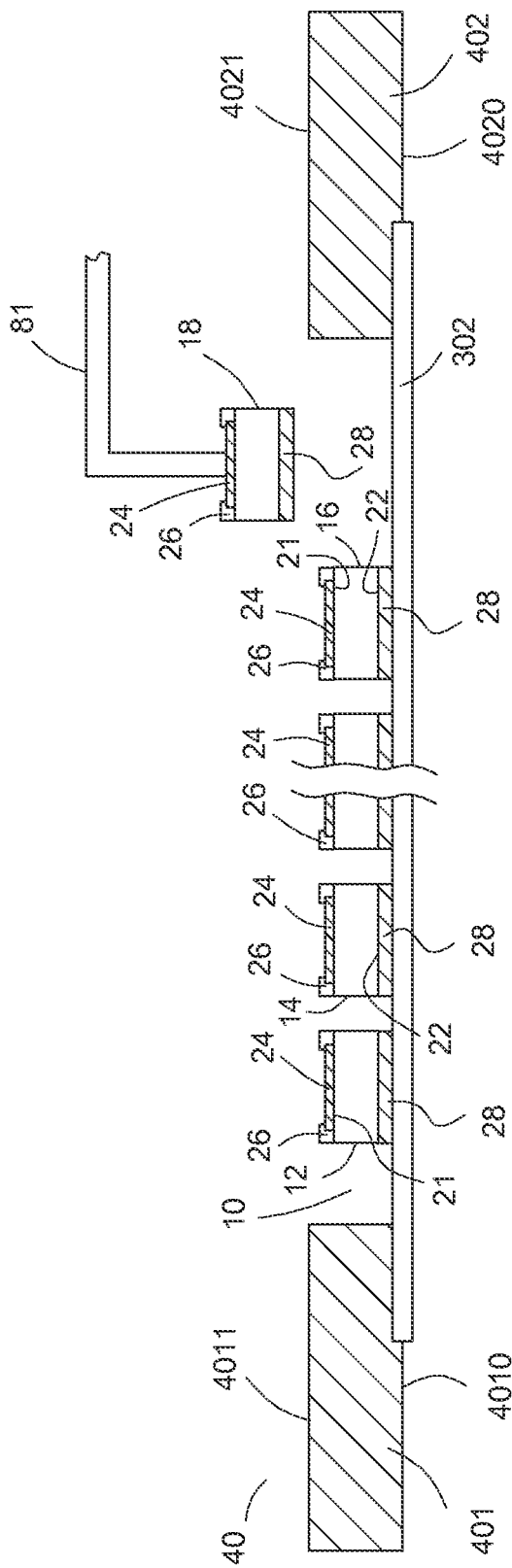
FIG. 11 illustrates a partial cross-sectional view of an embodiment of the semiconductor wafer of FIG. 10 or FIG. 15 at a later stage of processing in accordance with an embodiment of the present invention.

FIG. 10 illustrates a cross-sectional view of wafer 10 during subsequent processing. In one embodiment, carrier tape 301 can be exposed to a UV light source to reduce the adhesiveness of the tape. In one embodiment, a carrier tape 302 can be applied or attached to layer 28 of wafer 10, surface 4010 of frame portion 401, and surface 4020 of frame portion 402. In one embodiment, carrier tape 302, carrier tape 301, and carrier tape 30 can be similar materials. In another embodiment, carrier tape 302 can be a different material or can have different characteristics, such as adhesive and/or stretch characteristics, compared to carrier tape 30 and/or carrier tape 301. In accordance with the present embodiment, after carrier tape 302 is applied, carrier tape 301 can be removed from wafer 10 and frame 40 to expose conductive pads 24 overlying upper surface 21 of wafer 10. In a subsequent step, die 12, 14, 16, and 18 can be removed from carrier tape 302 as part of a further assembly process using, for example, a pick-and-place apparatus 81 as generally illustrated in FIG. 11. In one embodiment, carrier tape 302 can be exposed to a UV light source prior to the pick-and-place step to reduce the adhesiveness of the tape.

Figure 12:
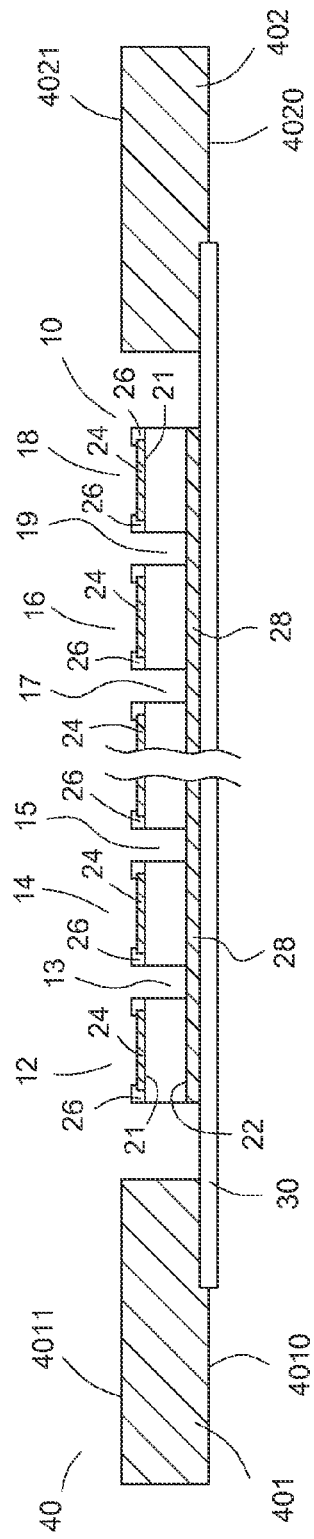
FIGS. 12-15 illustrate partial cross-sectional views of an embodiment of the semiconductor wafer of FIG. 1 at various stages of singulating die from the wafer in accordance with another embodiment of the present invention.
Figure 13:
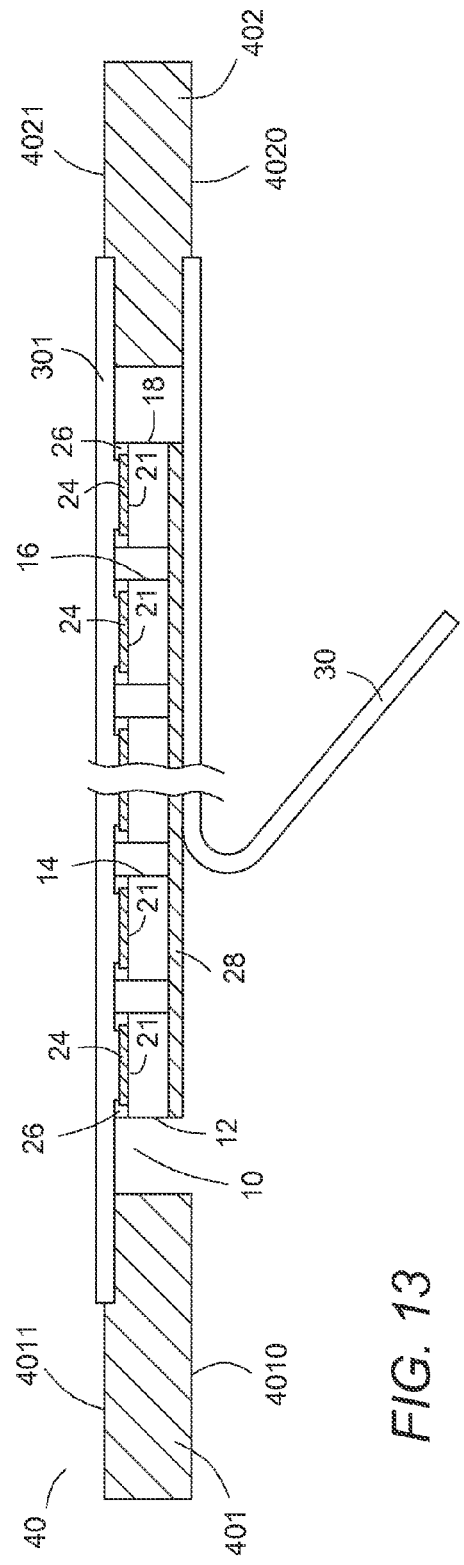

FIG. 12 illustrates a cross-sectional view of wafer 10 after a singulation process in accordance with an alternative embodiment. Wafer 10 can be attached to carrier tape 30, which is further attached to frame 40 as described previously in conjunction with FIG. 2. However, in this embodiment, carrier tape 301 can be applied or attached to contact pads 24 overlying upper surfaces of wafer 10 (that is, overlying major surface 21 of wafer 10), surface 4011 of frame portion 401, and surface 4021 of frame portion 402. In accordance with the present embodiment, after carrier tape 301 is applied, carrier tape 30 can be removed from layer 28, wafer 10, and frame 40 to expose layer 28 as illustrated in FIG. 13. In one embodiment, carrier tape 30 can be exposed to a UV light source to reduce the tackiness of the tape prior to the application of carrier tape 301.

Figure 14:
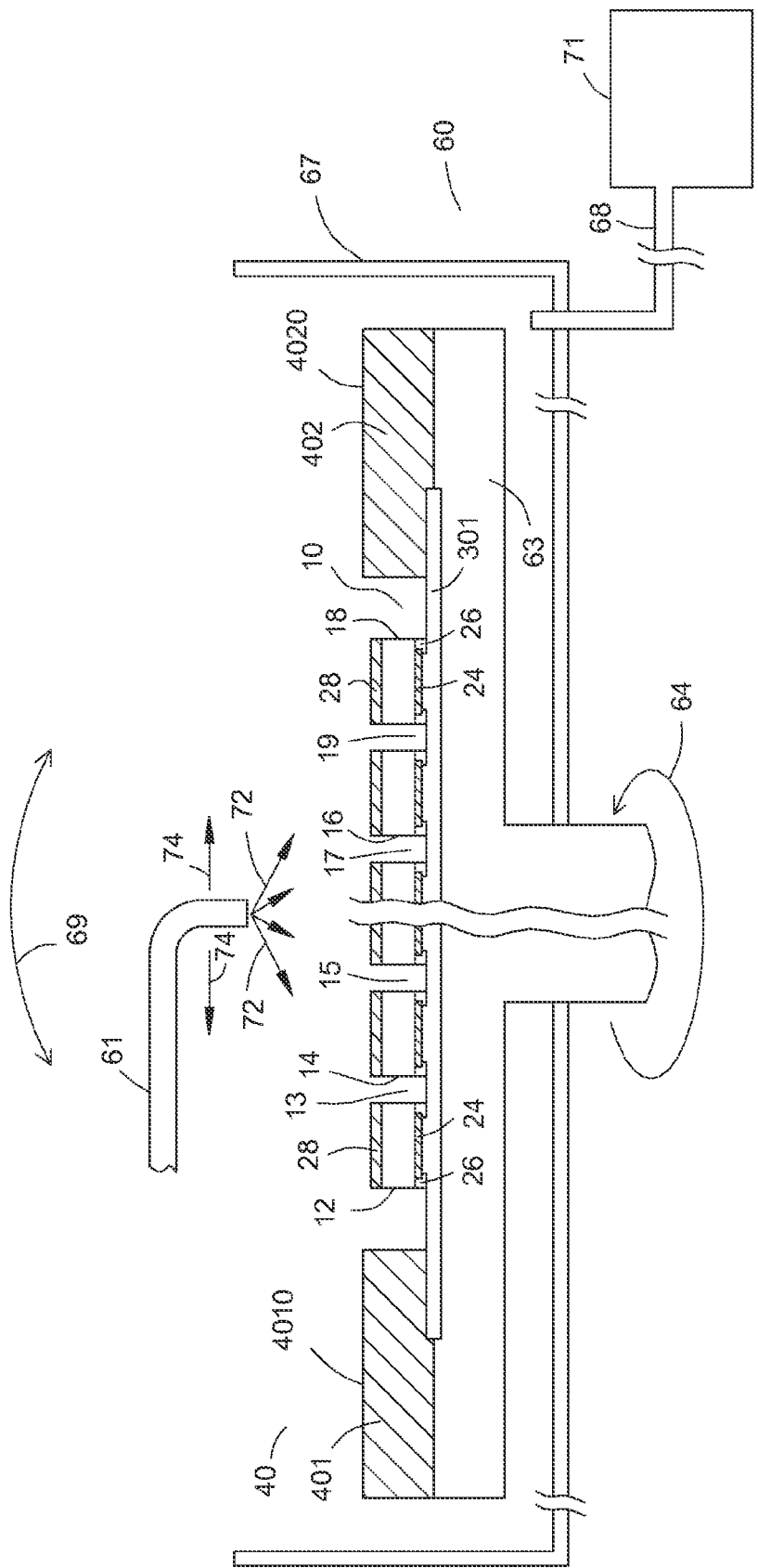

In a subsequent step, wafer 10 having layer 28 exposed or facing upward (or towards nozzle 61) is then placed within apparatus 60, and portions of layer 28 can be removed from singulation lines 13, 15, 17, and 19 as illustrated in FIG. 14. In one embodiment, the following process conditions can be used to remove portions of layer 28. For example, fluid 72 can be de-ionized water at a pressure from about 10,342 Kpa to about 20,684 Kpa (about 1500 psi to about 3000 psi) as measured at the fluid pump. Wafer 10 can be spinning at a rate from about 700 rpm to 1500 rpm with fluid 72 flowing onto wafer 10 from about 2 minutes to about 5 minutes.

Figure 15:
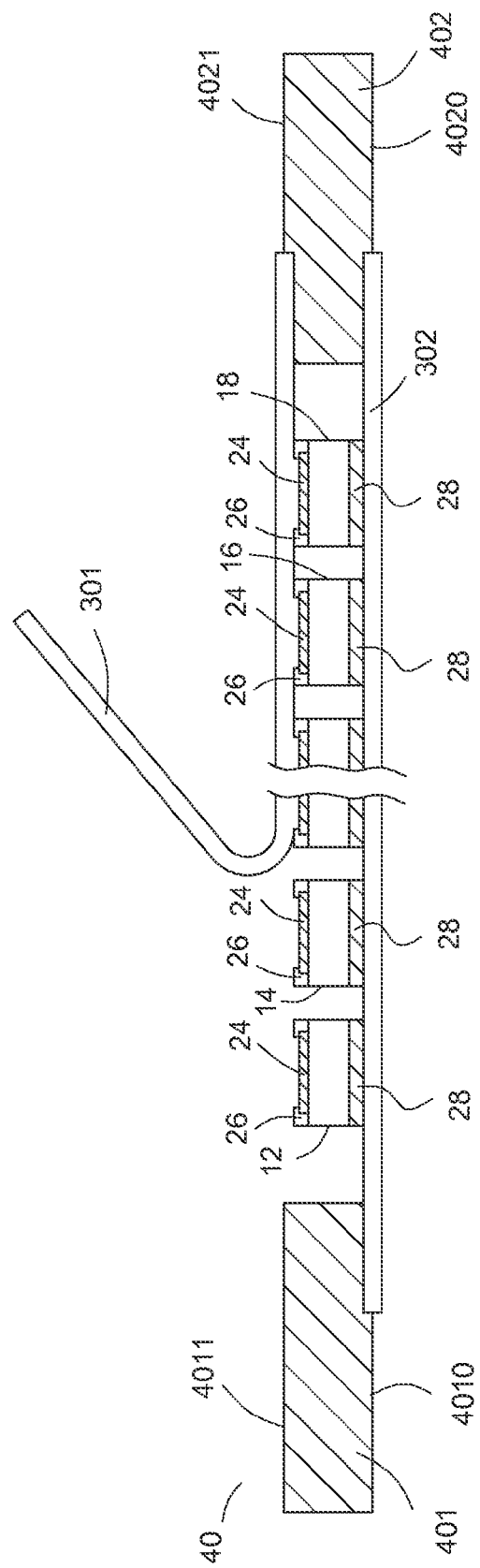

FIG. 15 illustrates a cross-sectional view of wafer 10 after further processing. In one embodiment, carrier tape 301 can be exposed to a UV light source to reduce the adhesiveness of the tape. Subsequently, carrier tape 302 can be applied or attached to layer 28 of wafer 10, surface 4010 of frame portion 401, and surface 4020 of frame portion 402. In accordance with the present embodiment, after carrier tape 302 is applied, carrier tape 301 can be removed from wafer 10 and frame 40 to expose conductive pads 24 overlying upper surface 21 of wafer 10. In a subsequent step, die 12, 14, 16, and 18 can be removed from carrier tape 302 using, for example, a pick-and-place apparatus 81 as generally illustrated in FIG. 11.

It is understood that carrier tape 30, 301, and/or 302 can be stretched or expanded during the fluid machining process to further assist in the removal of unwanted material from within the singulation lines. Also, apparatus 60 can include a megasonic apparatus to generate controlled acoustic cavitations in fluid 72. In addition, fluid 72 can be heated or cooled.

Figure 16:
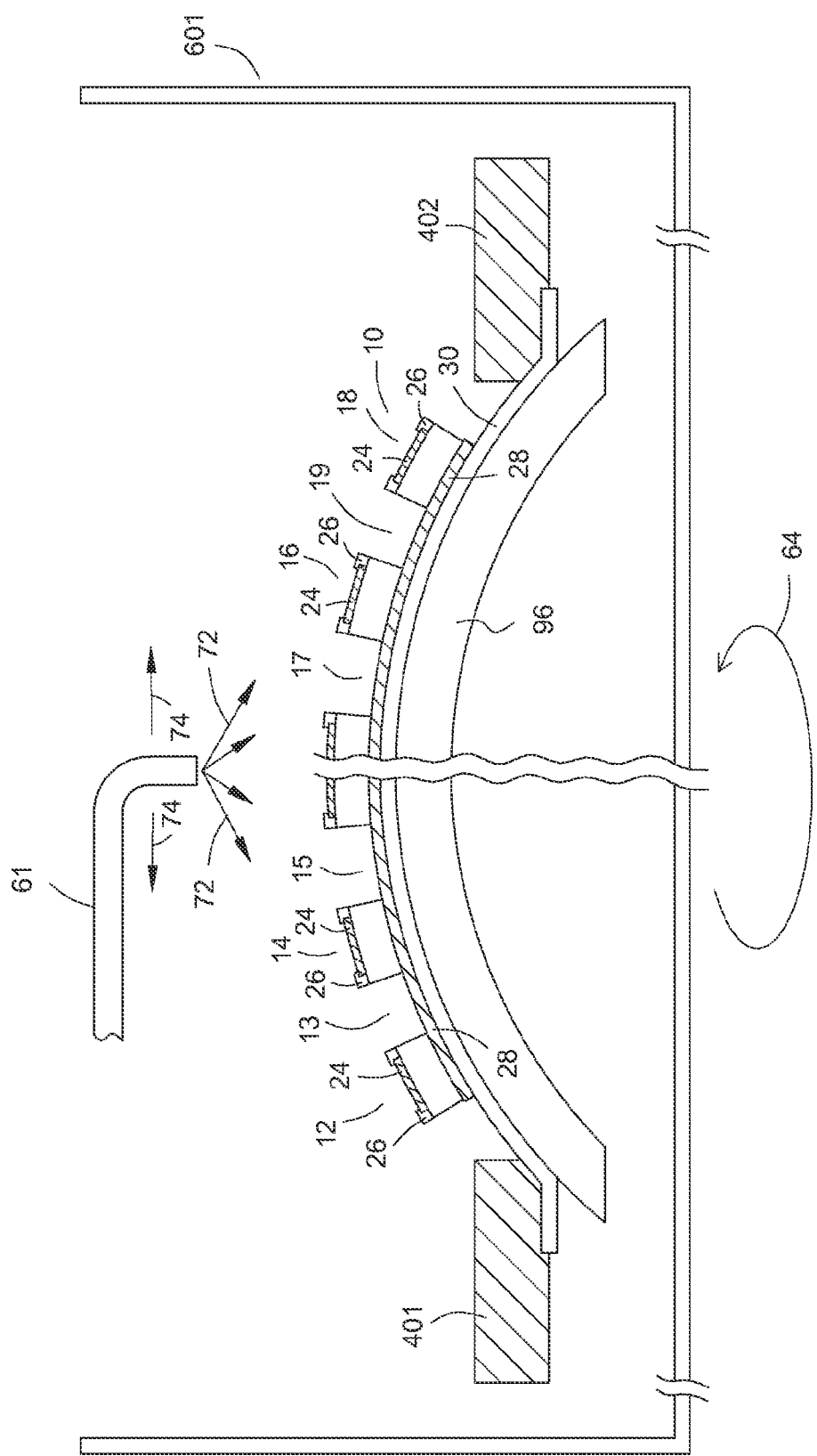
FIG. 16 illustrates a partial cross-sectional view of another embodiment of the present invention.

FIG. 16 illustrates a cross-section view of another embodiment. Wafer 10 on carrier substrate 10 can be placed in an apparatus 601, which can be similar to apparatus 60. In this embodiment, layer 28 can be a wafer backside coating (WBC) film, such as a die attach coating. In one embodiment, wafer 10 on carrier substrate 30 can be stretched to increase the distance between adjacent die. In one embodiment a work piece 96 can be used to stretch carrier substrate 30. Work piece 96 can be, for example, an arched bar or a domed structure. The stretching can enhance removal of layer 28 from singulation lines 13, 15, 17, and 19 using fluid 72. In one embodiment, wafer 10 can be cooled to a lower temperature to increase the brittleness of layer 28. In one embodiment, either fluid 72 or wafer 10 or both can be heated to enhance the removal of layer 28. In one embodiment, work piece 96 can move across wafer 10 when fluid 72 is flowing. In another embodiment, work piece 96 and wafer 10 can spin (as generally represented by arrow 64) when fluid 72 is flowing.

Figure 17:
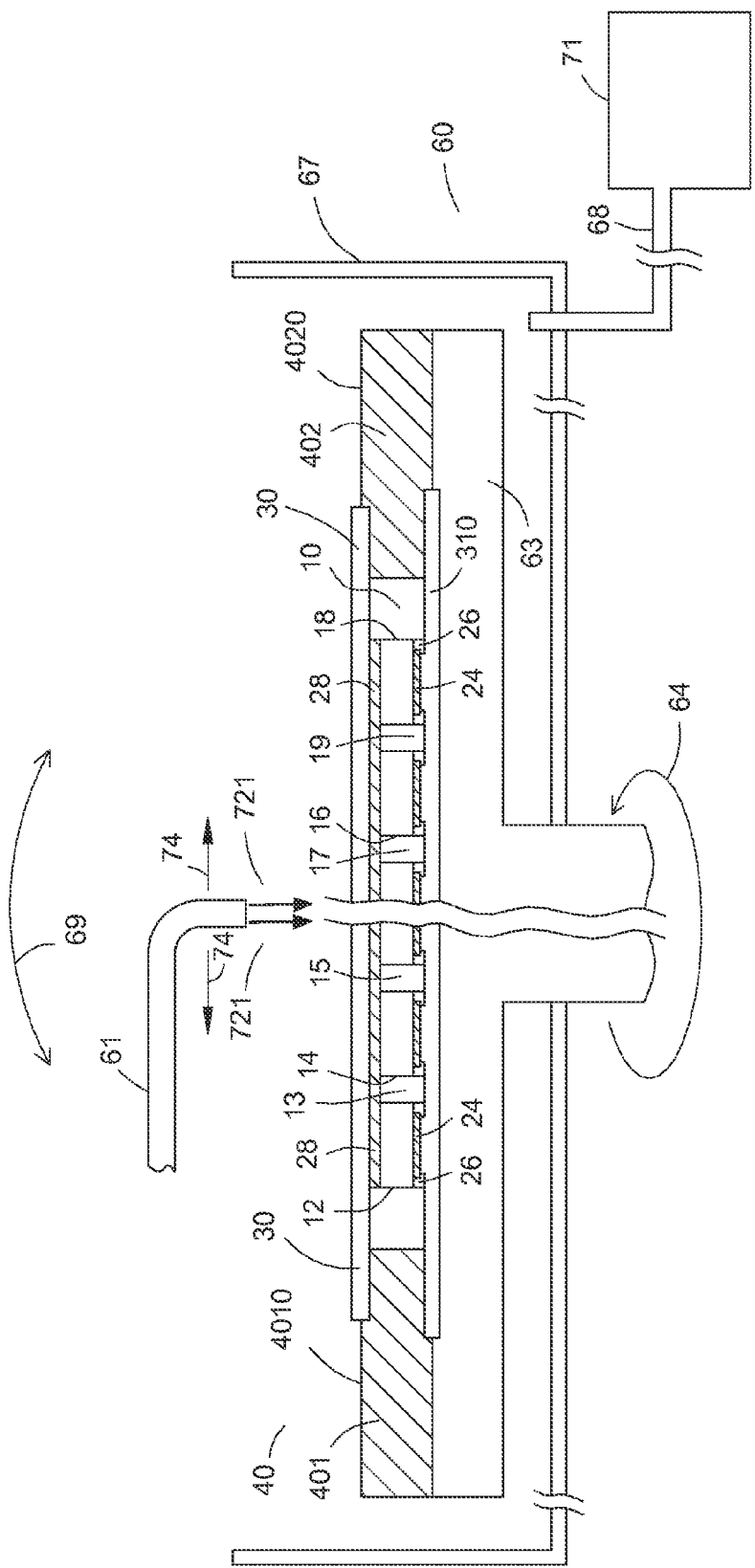
FIG. 17 illustrates a partial cross-section view of an embodiment of the semiconductor wafer of FIG. 1 at a subsequent stage of fabrication in accordance with a further embodiment of the present invention.

FIG. 17 illustrates a cross-section of a further embodiment. After wafer 10 is processed, for example, in accordance with FIGS. 2-4, a carrier or protective film 310 is provided to protect the front surface of wafer 10. In one embodiment, protective film 310 can be a carrier tape (such as carrier tape 301 described previously), a non-adhesive sheet, or other similar materials as known to those of skill in the art. In one embodiment, protective film 310 is configured to protect the front side of wafer 10 during subsequent processing. Wafer 10 is then placed within apparatus 60 with carrier tape 30 and layer 28 facing upward (towards nozzle 61), and portions of layer 28 can be separated from singulation lines 13, 15, 17, and 19 by using the fluid machining processes described previously but using carrier tape 30 as an intermediate or buffer layer to the pressured fluid. In one embodiment, fluid 721 is configured in a focused flow so that a smaller area of wafer 10 is contacted by fluid 721. In one embodiment, fluid 721 can be de-ionized water at a pressure from about 10,342 Kpa to about 20,684 Kpa (about 1500 psi to about 3000 psi) as measured at the fluid pump. Wafer 10 can be spinning at a rate from about 700 rpm to 1500 rpm with fluid 721 flowing onto wafer 10 from about 2 minutes to about 5 minutes. Also, the separation of layer 28 can be aided by ultrasonic waves or other high frequency techniques. Additionally, carrier tape 30 can be stretched during the fluid machining process. In addition, fluid 72 and/or carrier tape 30 can be heated or cooled. After separation, protective film 310 can be removed and die 12, 14, 16, and 189 can be removed from carrier tape 30 as part of a further assembly process using, for example, a pick-and-place apparatus 81 as generally illustrated in FIG. 11. In one embodiment, carrier tape 30 can be exposed to a UV light source prior to the pick-and-place step to reduce adhesiveness of the tape. In alternative embodiments, after the steps described in conjunction with FIG. 17, wafer 10 can be further processed in accordance with the steps described in conjunction with FIGS. 5, 8 and/or 14. In a further embodiment, work piece 96 (illustrated in FIG. 16) can be used to stretch carrier tape 30 and/or bend wafer 10 in a convex configuration to enhance removal of layer 28 from singulation lines 13, 15, 17, and 19 using fluid 721. In yet a further embodiment, a structure, such as a concave vacuum substrate, can be used to stretch carrier tape 30 and/or bend wafer 10 away from nozzle fixture 61 in a concave configuration.

From all of the foregoing, one skilled in the art can determine that, according to one embodiment, a method of singulating semiconductor die from a semiconductor wafer (for example, element 10) comprises providing a semiconductor wafer having a plurality of semiconductor die (for example, elements 12, 14, 16, 18) formed on the semiconductor wafer and separated from each other by spaces, wherein the semiconductor layer has first and second opposing major surfaces (for example, elements 21, 22), and wherein a layer of material (for example, element 28) is formed along the second major surface. The method includes placing the semiconductor wafer onto a first carrier substrate (for example, element 30), wherein the layer of material is adjacent the first carrier substrate and singulating the semiconductor wafer through the spaces to form singulation lines (for example, elements 13, 15, 17, 19), wherein singulating includes stopping in proximity to the layer of material; and separating portions of the layer of material within the singulation lines using a pressurized fluid (for example, element 721) applied to the first carrier substrate.

From all of the foregoing, one skilled in the art can determine that, according to another embodiment, in the foregoing method, the step of separating portions of the layer of material can comprise separating first portions of the layer of material using a first pressurized fluid applied to the first carrier substrate, and removing second portions of the layer of material using a second pressurized fluid.

From all of the foregoing, one skilled in the art can determine that, according to a further embodiment, the foregoing method can further comprise placing a protective film (for example, element 310) adjacent the first major surface.

From all of the foregoing, one skilled in the art can determine that according to a another embodiment, a method of singulating a substrate comprises providing a substrate (for example, element 10) having a plurality of die (for example, elements 12, 14, 16, 18) formed on the substrate and separated from each other by spaces, wherein the substrate has first and second opposing major surfaces (for example, elements 21, 22), and wherein a layer of material (for example, element 28) is formed overlying the second major surface. The method includes placing a first carrier tape (for example, element 30) onto the layer of material; plasma etching the substrate through the spaces to form singulation lines (for example, elements 13, 15, 17, 19), wherein the singulation lines terminate in proximity to the layer of material and applying a pressurized fluid (for example, element 721) to the first carrier tape to singulate portions of the layer of material from the singulation lines.

From all of the foregoing, one skilled in the art can determine that according to further embodiment, in the foregoing method, the step of applying the pressurized fluid can include applying a heated pressurized fluid.

From all of the foregoing, one skilled in the art can determine that, according to another embodiment, a method of singulating electronic die from a wafer comprises providing the wafer (for example, element 10) having a plurality of electronic die (for example, elements 12, 14, 16, 18) formed as part of the wafer and separated from each other by spaces defining where singulation lines (for example, elements 13, 15, 17, 19) will be formed, wherein the wafer has first and second opposing major surfaces (for example, elements 21, 22), and wherein a layer of material (for example, element 28) is formed overlying the second major surface. The method includes placing a first carrier tape (for example, element 30) onto the layer of material. The method includes plasma etching the wafer through the spaces to form the singulation lines while the semiconductor wafer is attached to the first carrier tape, wherein the singulation lines terminate in proximity to the layer of material. The method includes singulating portions of the layer of material in the singulation lines using a heated pressurized fluid (for example, element 721).

From all of the foregoing, one skilled in the art can determine that according to a further embodiment, the method described previously can further comprise placing a second carrier tape (for example, element 301) overlying the first major surface to support the semiconductor wafer and removing the first carrier tape. Additionally, the step of removing portions of the layer of material can include removing the portions using pressured water while the semiconductor wafer is spinning (for example, element 64).

In view of all of the above, it is evident that a novel method is disclosed. Included, among other features, is placing a substrate having a layer of material on a major surface of the substrate onto a carrier tape, and forming singulation lines through the substrate to expose portions of the layer of material within the singulation lines. A fluid machining process is then used to remove the exposed portions of the layer of material while the substrate is on a carrier tape. The method provides, among other things, an efficient, reliable, and cost effective process for singulating substrates that include back layers, such as backmetal layers or WBC layers.

While the subject matter of the invention is described with specific preferred embodiments and example embodiments, the foregoing drawings and descriptions thereof depict only typical embodiments of the subject matter, and are not therefore to be considered limiting of its scope. It is evident that many alternatives and variations will be apparent to those skilled in the art. For example, other forms of removable support materials can be used instead of carrier tapes.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of the invention. Furthermore, while some embodiments described herein include some but not other features included in other embodiments, combinations of features of different embodiments are meant to be within the scope of the invention and meant to form different embodiments as would be understood by those skilled in the art.

We claim:

1. A method of singulating semiconductor die from a semiconductor wafer comprising:
providing a semiconductor wafer having a plurality of semiconductor die formed on the semiconductor wafer and separated from each other by spaces, wherein the semiconductor layer has first and second opposing major surfaces, and wherein a layer of material is formed along the second major surface;
placing the semiconductor wafer onto a first carrier substrate, wherein the layer of material is adjacent the first carrier substrate;
singulating the semiconductor wafer through the spaces to form singulation lines, wherein singulating includes stopping in proximity to the layer of material; and separating portions of the layer of material within the singulation lines using a pressurized fluid applied to the first carrier substrate.

2. The method of claim 1, wherein separating portions of the layer of material comprises:
separating first portions of the layer of material using a first pressurized fluid applied to the first carrier substrate; and
removing second portions of the layer of material using a second pressurized fluid.

3. The method of claim 1, further comprising placing a protective film adjacent the first major surface.

4. The method of claim 3 where placing the protective film includes placing a carrier tape attached to a frame.

5. The method of claim 1, wherein separating portions of the layer of material includes using a heated pressurized fluid.

6. The method of claim 1 further comprising applying high frequency waves to the pressurized fluid.

7. The method of claim 6 further comprising heating the pressurized fluid.

8. The method of claim 1, wherein:
providing the semiconductor wafer comprises providing the semiconductor wafer having a backmetal layer overlying the second major surface; and
singulating the semiconductor wafer comprises plasma etching the semiconductor wafer.

9. The method of claim 1 further comprising bending the semiconductor wafer while separating portions of the layer of material.

10. The method of claim 1, wherein separating portions of the layer of material from the singulation lines comprises using pressurized water.

11. The method of claim 1, wherein separating portions of the layer of material from the singulation lines comprises using pressurized gas.

12. The method of claim 1 further comprising stretching the first carrier substrate.

13. A method of singulating a substrate comprising:
providing a substrate having a plurality of die formed on the substrate and separated from each other by spaces, wherein the substrate has first and second opposing major surfaces, and wherein a layer of material is formed overlying the second major surface;
placing a first carrier tape onto the layer of material;
plasma etching the substrate through the spaces to form singulation lines, wherein the singulation lines terminate in proximity to the layer of material; and
applying a pressurized fluid to the first carrier tape to singulate portions of the layer of material in the singulation lines.

14. The method of claim 13, wherein applying the pressurized fluid includes applying a heated pressurized fluid.

15. The method of claim 13 further comprising applying high frequency waves to the pressurized fluid.

16. The method of claim 13, wherein providing the substrate includes providing a semiconductor wafer having a conductive layer formed overlying the second major surface.

17. A method of singulating electronic die from a wafer comprising:
providing the wafer having a plurality of electronic die formed as part of the semiconductor wafer and separated from each other by spaces defining where singulation lines will be formed, wherein the wafer has first and second opposing major surfaces, and wherein a layer of material is formed overlying the second major surface;
placing a first carrier tape onto the layer of material;
plasma etching the wafer through the spaces to form the singulation lines while the wafer is attached to the first carrier tape, wherein the singulation lines terminate in proximity to the layer of material; and
singulating portions of the layer of material in the singulation lines using a heated pressurized fluid.

18. The method of claim 17, wherein singulating portions of the layer of material comprises applying the heated pressurized fluid wherein the first carrier tape is between the heated pressurized fluid and the layer of material.

19. The method of claim 17 further comprising heating the first carrier tape as portions of the layer of material are removed.

20. The method of claim 17 further comprising attaching a protective film to the first major surface before removing portions of the layer of material.

* * * * *